United States Patent [19]

Kubota et al.

[11] Patent Number: 4,698,660
[45] Date of Patent: Oct. 6, 1987

[54] RESIN-MOLDED SEMICONDUCTOR DEVICE

[75] Inventors: Akihiro Kubota; Tsuyoshi Aoki, both of Kawasaki; Michio Ono, Tokyo; Rikio Sugiura, Sagamihara, all of Japan

[73] Assignee: Fujitsu Limited, Kawasaki, Japan

[21] Appl. No.: 833,535

[22] Filed: Feb. 12, 1986

Related U.S. Application Data

[63] Continuation of Ser. No. 478,727, Mar. 25, 1983, abandoned.

[30] Foreign Application Priority Data

Mar. 30, 1982 [JP] Japan .................................. 57-052061

[51] Int. Cl.⁴ ....................... H01L 23/50; H01L 23/00
[52] U.S. Cl. ........................................ 357/70; 357/72; 357/74; 174/52 FP
[58] Field of Search ............................ 357/70, 72, 74; 174/52 FP

[56] References Cited

U.S. PATENT DOCUMENTS

| | | | |
|---|---|---|---|
| 3,940,786 | 2/1976 | Scheingold et al. | 357/74 |
| 4,142,287 | 3/1979 | Grabbe | 357/70 |
| 4,195,193 | 3/1980 | Grabbe et al. | 357/70 |
| 4,224,637 | 9/1980 | Hargis | 357/70 |
| 4,463,217 | 7/1984 | Orcutt | 357/74 |

FOREIGN PATENT DOCUMENTS

| | | | |
|---|---|---|---|
| 2360174 | 2/1978 | France | 357/70 |
| 2456390 | 12/1980 | France | 357/70 |
| 57-155758 | 9/1982 | Japan | 357/68 |

OTHER PUBLICATIONS

IEEE Transactions on Components, Hybrids, and Manufacturing Technology, vol. CHMT-3, No. 4, Dec. 1980, "Development of a 68-Pin Multiple In-Line Package", William L. Brodsky et al.

Primary Examiner—Andrew J. James
Assistant Examiner—Jerome Jackson
Attorney, Agent, or Firm—Staas & Halsey

[57] ABSTRACT

A resin-molded semiconductor package device includes a plurality of grooves which are spaced a predetermined distance from each other in the edge portions defined by the main surface and the side surfaces of the main body of a resin-molded package, which grooves correspond to a plurality of external leads. The external leads are folded, the tips of the external leads are positioned in the grooves, and the middle portions of the external leads are located above the main surface of the package so that a predetermined standoff distance is maintained between the middle portions of the external leads and the package.

5 Claims, 7 Drawing Figures

RESIN-MOLDED SEMICONDUCTOR DEVICE

This is a continuation of co-pending application Ser. No. 478,727, filed on Mar. 25, 1983, and now abandoned.

BACKGROUND OF THE INVENTION

The present invention relates to a resin-molded type of semiconductor device package and more particularly to an improvement in the construction of a leaded chip carrier package.

In a resin-molded type of semiconductor device package, a chip, which is a circuit element, is mounted on the chip-mounting portion of a lead frame. The lead frame is formed as a unitary structure, the chip is connected to internal leads through wires, and a resin is molded around the chip, the wires, and the internal leads. A package of this type can be manufactured at a lower cost than ceramic-type packages.

In recent years, a variety of types of chip carriers have been proposed to meet the demand for the construction of smaller-sized packages. A ceramic-type chip carrier having no external leads is called a leadless chip carrier. A resin-molded type of chip carrier having short external leads is called a leaded chip carrier which has a cost advantage over the ceramic-type chip carrier. Both ceramic-type chip carriers and resin-molded chip carriers are constructed so that they are small in size, and both are mounted on a printed circuit board by means of a simple soldering operation. It is unnecessary to insert the external leads into the holes of the printed board, as is necessary in the case of conventional dual in-line package.

In the known resin molded leaded chip carriers, the leads, which are flat, are soldered on the conductor patterns of a printed circuit board having a flat plane. The following drawbacks are created:
1. Whether soldering is complete cannot be determined by viewing the exterior of the package.
2. When there is a projection on the printed circuit board the leads of the chip carrier do not completely contact the conductor patterns of the printed circuit board, with the result that soldering of the chip carrier to the printed circuit board cannot be effected.
3. The mechanical strength of the connection between the leads and the conductor patterns by the solder is weak.
4. The leads cannot completely absorb the difference in the heat expansion coefficient between the printed board and the chip carrier, with the result that undesirable stresses are created on the leads.

A chip carrier assembly having a standoff distance and having the objective of eliminating the above-mentioned drawbacks was disclosed in IEEE Transactions On Components, Hybrids, And Manufacturing Technology, Vol. CHMT-3, No. 4, December 1980, "Development of a 68-Pin Multiple In-Line Package" by William L. Brodsky et al. However, the chip carrier assembly disclosed by William L. Brodsky et al has the following drawbacks:
1. The manufacturing process, particularly the lead bending operation is not easy.
2. The flux used in the soldering operation remains in the hollow portions of the main surface.
3. The soldering state cannot be visually examined from the exterior of the package because of the projecting portions.
4. When the number of leads is increased in accordance with the development of a high density integratedcircuit device, the neighboring external leads are often short-circuited if they are deformed, and the standoff distance, a necessary distance between the mother board and the main surface of the package when the chip carrier is mounted, is no longer maintained.

SUMMARY OF THE INVENTION

An object of the present invention is to provide a semiconductor device package of the chip carrier type, which is capable of preventing short-circuits between neighboring external leads.

Another object of the present invention is to provide a semiconductor device package of the chip carrier type which is capable of reliably maintaining a standoff distance when a semiconductor device is mounted.

A further object of the present invention is to provide a semiconductor device package of the chip carrier type in which the bending of the external leads can easily be performed during the manufacturing process.

Still another object of the present invention is to provide a semiconductor device package of the chip carrier type which is capable of allowing easy visual inspection of the soldered condition of the leads after it is soldered onto a printed circuit board.

Yet another object of the present invention is to provide a semiconductor device package of the resin-molded leaded chip carrier type which is capable of ensuring contact between its leads and the conductor patterns of a printed circuit board during the soldering operation, despite a possible deformation of either the chip carrier or the board.

The above-mentioned objects can be achieved by providing a resin-molded semiconductor device package comprising a resin-molded main body and a plurality of outer leads extending out of said main body, the main body having a main surface and a plurality of side surfaces from which said outer leads extend. The main body also has a plurality of grooves which are spaced at a predetermined distance from each other along the edges defined by the main surface and the side surfaces of the main body, each of the grooves opening at the main surface and at one of the side surfaces and corresponding to each of the external leads respectively. The external leads are bent so that the tips of the external leads are positioned in the grooves, and the middle portions of the external leads are located above the main surface in order to maintain a predetermined standoff distance.

Further features and advantages of the present invention will be apparent from the ensuing description, made with reference to the accompanying drawings, to which, however, the scope of the invention is in no way limited.

DESCRIPTION OF THE PREFERRED EMBODIMENTS

Figure 1:
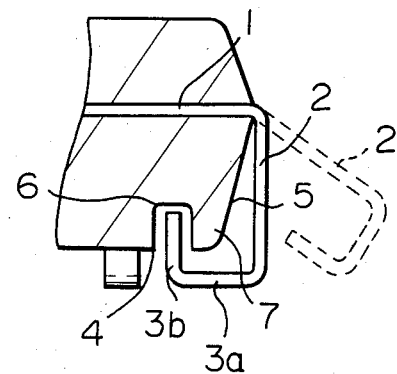
FIG. 1 is a partial sectional view of a prior art resin-molded semiconductor device package.

FIG. 1 is a partial sectional view of the conventional resin-molded semiconductor device package of the type disclosed in the article mentioned above but which has the previously mentioned drawbacks. In FIG. 1, reference numeral 1 denotes an internal lead, 2 denotes an external lead, 3a and 3b, respectively, denote a middle portion and an end portion of the external lead 2, 4 denotes the main surface of the main body, 5 denotes a side surface of the main body, 6 denotes a hollow portion of the main body, and 7 denotes a side wall portion of the main body. As is shown in FIG. 1, when the hollow portion 6 is formed so as to open only on the main surface 4, it becomes difficult to bend the end portion 3b of the external lead 2 in the final bending step due to the presence of the projecting portion 7.

Figure 2:
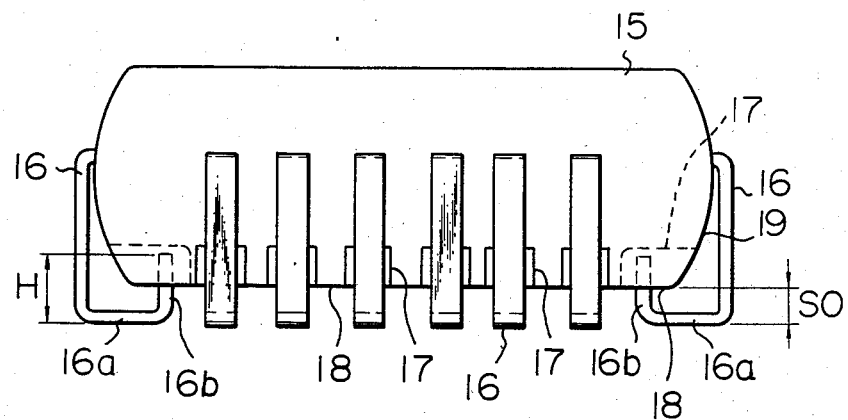
FIG. 2 is a side view of an embodiment of the resin-molded semiconductor device package according to the present invention.
Figure 3:
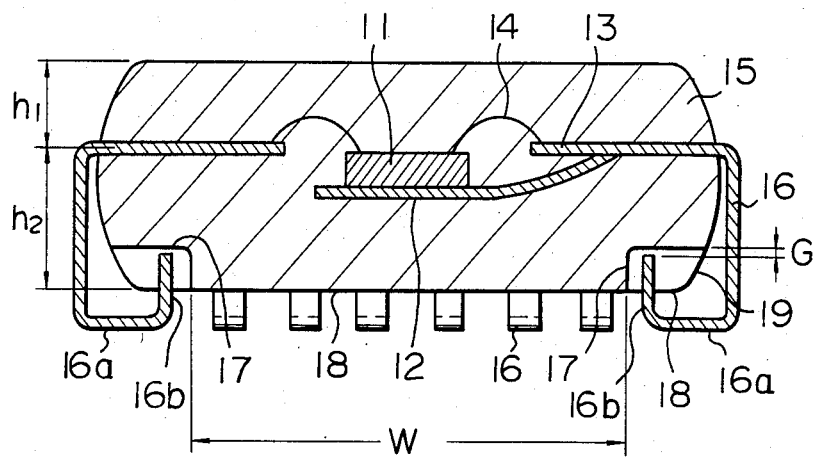
FIG. 3 is a cross-sectional view of the embodiment of the resin-molded semiconductor device shown in FIG. 2.
Figure 4:
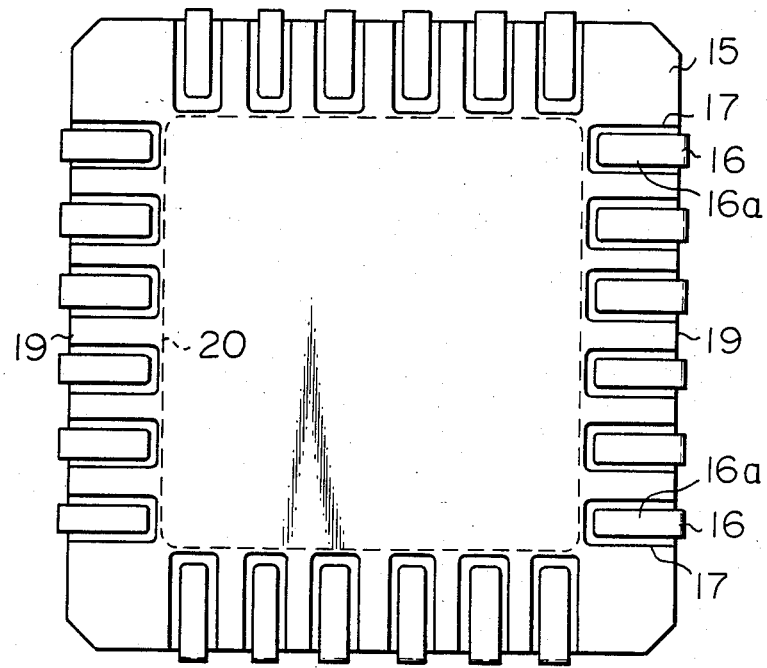
FIG. 4 is a plan view of the embodiment of the resin-molded semiconductor device package shown in FIG. 2.

A description of a resin-molded semiconductor device package of the leaded chip carrier type according to an embodiment of the present invention, in connection with FIGS. 2 to 4, follows.

FIG. 2 is a side view, FIG. 3 is a sectional view, and FIG. 4 is a plan view all of an embodiment of the present invention. In these drawings, the same portions are denoted by the same reference numerals.

In the semiconductor device of this embodiment, a chip 11, which is a circuit element, is attached to a chip-mounting portion of a lead frame 12. The chip 11 is connected to internal leads 13 via wires 14, and a resin 15 is molded around the chip 11, the wires 14, the lead frame 12, and the internal leads 13. Grooves 17 are formed in the edge portions defined by the main surface 18 and the side surfaces 19 of the package. Each groove 17 opens at both the main surface 18 and one of the side surfaces 19. The grooves 17 are spaced at a predetermined distance from each other and respectively correspond to external leads 16, which are so folded that their tips 16b are positioned in the grooves 17 and their middle portions 16a are parallel to the main surface 18, with the result that a predetermined standoff distance, SO, is maintained.

In this embodiment, the tips 16b of the external leads 16 are positioned in the grooves 17, therefore, the external leads 16 experience no sideways deformation and do not come into contact with each other.

Further, since the tips 16b of the external leads 16 are formed perpendicular to or aslant (explained later) to the main surface 18, the external leads 16 are not likely to be deformed due to an accidentally imposed slight pressure exerted on the upper part of the package. Thus, the standoff distance, SO, is not lost even when the middle portions 16a are soldered onto a mother board, such as a printed board. The standoff distance, SO, is the distance between the main surface 18 of the package and the mother board (not shown) when the device is mounted. The standoff distance plays an important role in the heat radiation of the semiconductor device. Without the tips 16b, the middle portions 16a tend to bend toward the main surface 18, and the predetermined standoff distance, SO, is not maintained.

According to this embodiment of the present invention, the tips 16b, which have a length H, come into contact with the portion of the grooves 17 defining a plane parallel to the main surface 18 and function as support rods even when the middle portions 16a are inclined to deform toward the main surface 18. Therefore, the external leads 16 are not easily deformed.

On the other hand, the outer leads may be slightly deformed by intentionally depressing the package on a printed circuit board before the soldering process to ensure contacts between all the outer leads and the conductor patterns of the printed circuit boards. This operation provides a practical advantage when the package or the board is undesirably warped.

Furthermore, according to this embodiment, there is a small gap G between the ends of the tips 16b and the walls of the grooves 17, and there is a standoff, SO, between the main surface 18 and the middle portions 16a so that the external leads 16 are allowed to turn with their root portions as centers. Therefore, even when stress is generated due to thermal expansion and contraction of the printed circuit board or thermal expansion and contraction of the resin 15 of the package after the device has been soldered onto the board, the external leads 16, which are resilient, absorb the stress. Namely, a device mounted on a printed circuit board via the middle portions 16a can withstand changes in external temperature.

In a chip carrier package having leads, in general, the resin 15 is divided into a portion above the internal leads and a portion below the internal leads, as is shown in FIG. 3, the upper portion having a thickness $h_1$ and the lower portion having a thickness $h_2$ and the relationship $h_1 < h_2$ (for example, $h_2$ is 1.5 times as great as $h_1$) being maintained. Therefore, when the resin is molded, a greater amount of stress s accumulated in the lower portion than in the upper portion due to thermal contraction in the lower portion, with the result that the package undergoes deformation.

In the embodiment of the present invention, however, since a plurality of grooves 17 are formed in the edge portions defined by the main surface 18 and the side surfaces 19, the substantial width of the lower portion of resin is as denoted by W in FIG. 3, and the corresponding stress is reduced. Accordingly, the imbalance in stress accumulated in the upper portion of resin and in the lower portion of resin is reduced, and the package is prevented from being deformed.

After the soldering process for mounting the device onto a printed circuit board, which may be conducted in the conventional manner, the flux used in the process can be easily rinsed out and the soldered condition can be visually inspected because the soldered portions are exposed at side openings of the grooves.

Figure 5:
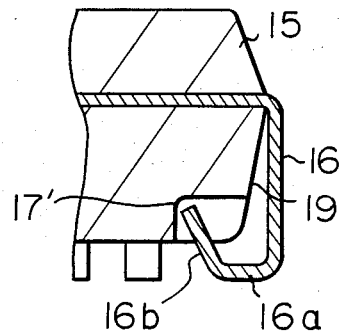
FIG. 5 is a partial sectional view illustrating the manufacturing steps of the resin-molded semiconductor device package according to the present invention.

FIG. 5 is a sectional view illustrating a portion of another embodiment of the present invention. In this embodiment, the ends of the tips 16b of the external leads 16 are folded toward the bottom end corners 17' of the grooves 17 opposite to the side surfaces 19 and positioned at a predetermined distance from the bottom end corners 17'. When pressure is exerted from the exterior, the ends of the tips 16b come into contact with the corners 17' so that their positions are fixed. Therefore, the external leads 16 are not bend undesirably.

In either case, the tips 16b and the middle portions 16a of the external leads 16 are located apart from the main body of the package. The process for bending the outer leads may be conducted as follows: the external leads 16 are first folded from the side of the tips 16b, and the boundary portion between the internal leads 13 and the external leads 16 is then folded. According to the present invention, the grooves 17 are formed not only in the main surface 18 but also in the side surfaces 19. Accordingly, the tips 16b of the external leads 16 can be easily folded without any obstructions, as is shown in FIG. 1.

Figure 6:
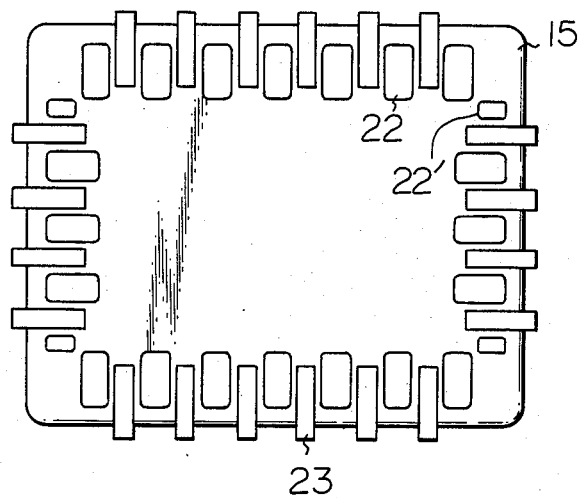
FIG. 6 is a plan view of another embodiment of the resin-molded semiconductor device package according to the present invention.
Figure 7:
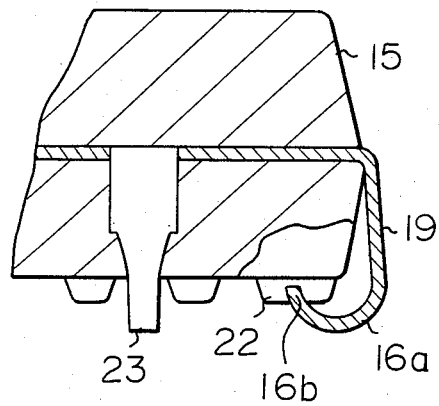
FIG. 7 is a partial sectional view of the resin-molded semiconductor device package shown in FIG. 6.

FIG. 6 is a plan view of another embodiment of the present invention. In FIG. 6, grooves are formed between adjacent projecting portions 22 or between the projecting portions 22 and 22'. This embodiment corresponds to a case in which the embodiment of FIG. 4 is modified so that a portion 20 (FIG. 4) is formed, not at the main surface level, but at the bottom level of the grooves 17. FIG. 7 is a partial sectional view of FIG. 6. In the embodiment shown in FIGS. 6 and 7, the same function and result as that in the embodiment shown in FIGS. 3 to 5 can be obtained, except that the grooves defined by the projection portions 22 do not have bottom corner portions 17' as in FIG. 5 to stop the tips 16b when pressure is imposed onto the package downwardly.

According to the semiconductor device of the present invention as described above, short-circuiting does not occur between the external leads, the standoff distance is not lost due to deformation of the external leads, the device is not deformed due to thermal contraction, less stress builds up due to thermal expansion, and operability is not lost in the outer lead folding step. After the device is mounted on a printed circuit board by soldering, the flux used can be easily rinsed out and the soldered condition can be easily examined by a visual inspection.

We claim:

1. A resin-molded semiconductor device package, comprising:
    a resin-molded main body having a main surface, a plurality of side surfaces and a plurality of grooves formed therein, said grooves being spaced a predetermined distance from each other along edge portions defined by the main surface and the side surfaces of said resin-molded main body, said grooves opening at the main surface and at one of the side surfaces, defining a bottom surface and having a depth measured from the main surface to the bottom surface, the number of said grooves corresponding to the number of said external leads respectively; and
    a plurality of external leads extending from said resin-molded main body, having tips and plastically deformable middle portions, and being bent to position the tips of said external leads in said grooves, the tips being spaced apart from each of the corresponding bottom surfaces of the grooves to form gaps, the tips having a height greater than the depth of the grooves, and the middle portions of said external leads being positioned spaced from the plane extending along said main surface forming a predetermined standoff distance, the tips of the external leads contacting the bottom surfaces of the grooves and substantially maintaining the standoff distance after the middle portions of the external leads are plastically deformed by being pressed toward the plane extending along the main surface of the resin-molded main body.

2. A resin-molded semiconductor device package according to claim 1, wherein each of said grooves has a first side surface substantially perpendicular to said main surface, wherein the bottom surface of each groove is substantially perpendicular to one of said side surfaces, and wherein each groove has a bottom end corner positioned at the intersection of the first side surface and the bottom surface.

3. A resin-molded semiconductor device package, comprising:
    a resin-molded main body having a main surface and a plurality of projections positioned at a predetermined distance from each other on the main surface, and grooves having a depth being defined between each two consecutive projections; and
    a plurality of external leads corresponding to respective ones of the grooves extending from the main body and having middle portions and tips, the tips being positioned in the grooves and spaced apart from the main surface and the middle portions being spaced from a plane extending along the main surface of the main body to create a predetermined standoff distance, the tips having a height greater than the depth of the grooves, the tips contacting the main surface of the main body and substantially maintaining the standoff distance when the middle portions are pressed toward the plane extending along the main surface.

4. A resin-molded semiconductor device package, comprising:
    a resin-molded main body having a main surface, a plurality of side surfaces, and a plurality of grooves formed at a predetermined distance from each other along edge portions defined by the intersections of the main surfaces and the side surfaces, each groove having a bottom surface, opening at the main surface and at one of the side surfaces and having a depth; and
    a plurality of external leads corresponding to respective ones of the grooves extending from the main body and having middle portions and tips, the tips being positioned in the grooves and spaced apart from the bottom surfaces of the grooves and the middle portions being spaced apart from the plane extending along the main surface to create a predetermined standoff distance, the tips having a height greater than the depth of the grooves, the tips contacting the main surface and substantially maintaining the standoff distance when the middle portions are pressed toward the plane extending along the main surface.

5. A resin-molded semiconductor device package according to claim 4, wherein the grooves have first side surfaces substantially perpendicular to the main surface, wherein the bottom surfaces of the grooves are substantially perpendicular to one of the side surfaces, wherein bottom end corners are defined by the intersections of the first side surfaces and the bottom surface, and wherein the tips are positioned at a predetermined distance from the bottom end corners.

* * * * *

UNITED STATES PATENT AND TRADEMARK OFFICE
CERTIFICATE OF CORRECTION

PATENT NO. : 4,698,660

DATED : October 6, 1987

INVENTOR(S) : Kubota et al.

It is certified that error appears in the above-identified patent and that said Letters Patent is hereby corrected as shown below:

Col. 2, line 64, after "device" insert --package--.

Col. 6, line 62, "surface" should be --surfaces--.

Signed and Sealed this

Twenty-ninth Day of March, 1988

Attest:

DONALD J. QUIGG

*Attesting Officer*  *Commissioner of Patents and Trademarks*